US012687792B2

(12) United States Patent
Krone et al.

(10) Patent No.: US 12,687,792 B2
(45) **Date of Patent: *Jul. 21, 2026**

(54) OPTICAL SYSTEM, TEST DEVICE, LITHOGRAPHY APPARATUS, ARRANGEMENT AND METHOD

(71) Applicant: Carl Zeiss SMT GmbH, Oberkochen (DE)

(72) Inventors: Stefan Krone, Ellwangen (DE); Ralf Kiesel, Gaildorf (DE); Volker Wieczorek, Neu-Ulm (DE); Kai Kunze, Schwaebisch Gmuend (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 38 days.

This patent is subject to a terminal disclaimer.

(21) Appl. No.: 18/669,926

(22) Filed: May 21, 2024

(65) Prior Publication Data

US 2024/0302754 A1 Sep. 12, 2024

Related U.S. Application Data

(63) Continuation of application No. PCT/EP2022/083635, filed on Nov. 29, 2022.

(30) Foreign Application Priority Data

Dec. 1, 2021 (DE) ..................... 10 2021 213 612.5

(51) Int. Cl.

*H01H 31/02* (2006.01)
*G01R 31/28* (2006.01)
*G03F 7/00* (2006.01)

(52) U.S. Cl.

CPC ....... *G03F 7/70891* (2013.01); *G01R 31/282* (2013.01); *G03F 7/70591* (2013.01)

(58) Field of Classification Search

CPC .............. G01R 31/282; G01R 31/2829; G03F 7/70075; G03F 7/70116; G03F 7/70525;

(Continued)

(56) References Cited

U.S. PATENT DOCUMENTS 6,573,978 B1 6/2003 McGuire, Jr.
8,582,443 B1 11/2013 Sun et al.

(Continued)

FOREIGN PATENT DOCUMENTS

DE 10 2008 009 600 A1 8/2009
DE 10 2013 220 464 A1 11/2014

(Continued)

OTHER PUBLICATIONS

International Search Report and Written Opinion for corresponding PCT Appl No. PCT/EP2022/083635, dated Mar. 22, 2023.

(Continued)

*Primary Examiner* — Thang X Le
(74) *Attorney, Agent, or Firm* — Fish & Richardson P.C.

(57) ABSTRACT

An optical system comprises a number of optics modules, wherein the respective optics module comprises: a number of displaceable optical elements for guiding radiation in the optical system; a number of actuator/sensor devices, wherein at least one of the actuator/sensor devices is assigned to the respective optical element, wherein the respective actuator/sensor device is configured to displace the assigned optical element and/or to acquire a position of the assigned optical element; a vacuum-tight housing; and an electronics unit in the vacuum-tight housing and configured to actuate the respective actuator/sensor device on the basis of received actuation data, wherein the electronics unit has a first electronics region containing a number of electrical and/or electronic component parts and that generates, (Continued)

and a second electronics region containing a number of electrical and/or electronic component parts.

20 Claims, 5 Drawing Sheets

(58) Field of Classification Search
CPC ............. G03F 7/70591; G03F 7/70891; G03F 7/70991
See application file for complete search history.

(56) References Cited

U.S. PATENT DOCUMENTS

| | | | | |
|---|---|---|---|---|
| 8,908,192 | B2 * | 12/2014 | Goeppert ............ | G03F 7/70941 356/520 |
| 2006/0132747 | A1 | 6/2006 | Singer et al. | |
| 2006/0138354 | A1 * | 6/2006 | Bakker ............... | G03F 7/70958 250/492.21 |
| 2010/0133902 | A1 | 6/2010 | Gotou et al. | |
| 2014/0266238 | A1 | 9/2014 | Furse et al. | |
| 2016/0170201 | A1 | 6/2016 | Holz et al. | |
| 2016/0320608 | A1 * | 11/2016 | Krone ................. | G03F 7/70075 |
| 2018/0074303 | A1 | 3/2018 | Schwab | |
| 2019/0187574 | A1 | 6/2019 | Holz et al. | |
| 2019/0324372 | A1 | 10/2019 | Wolfsteiner et al. | |
| 2020/0272058 | A1 | 8/2020 | Bieling et al. | |
| 2021/0132502 | A1 | 5/2021 | Robinson et al. | |
| 2021/0364926 | A1 | 11/2021 | Hoffmann et al. | |
| 2024/0302453 | A1 | 9/2024 | Krone et al. | |

FOREIGN PATENT DOCUMENTS

| | | | |
|---|---|---|---|
| DE | 10 2014 202 755 | A1 | 8/2015 |
| DE | 102014206546 | A1 | 10/2015 |
| DE | 102015202800 | A1 | 8/2016 |
| DE | 10 2017 200 774 | A1 | 4/2017 |
| DE | 10 2017 220 586 | A1 | 5/2019 |
| DE | 102019201810 | A1 | 8/2020 |
| EP | 1 614 008 | B1 | 12/2009 |
| WO | WO 2014/083143 | A1 | 6/2014 |
| WO | WO 2018/041670 | A1 | 3/2018 |

OTHER PUBLICATIONS

Endendijk et al., "Successful implementation of a MEMS micromirror array in a lithograpy illumination system," Paper, Presented at the 2013 Transducers & Eurosensors XXVII: The 17th International Conference on Solid-State Sensors, Actuators and Microsystems (Transducers & Eurosensors XXVII), Barcelona, Spain, Jun. 16-20, 2013, pp. 2564-2567.

Office Action in U.S. Appl. No. 18/666,211, mailed on Dec. 30, 2025, 31 pages.

Office Action in Korean Appln. No. 10-2024-7020617, mailed on Apr. 29, 2026, 14 pages (with English translation).

* cited by examiner

OPTICAL SYSTEM, TEST DEVICE, LITHOGRAPHY APPARATUS, ARRANGEMENT AND METHOD

CROSS-REFERENCE TO RELATED APPLICATIONS

The present application is a continuation of, and claims benefit under 35 USC 120 to, international application No. PCT/EP2022/083635, filed Nov. 29, 2022, which claims benefit under 35 USC 119 of German Application No. 10 2021 213 612.5, filed Dec. 1, 2021. The entire disclosure of each of these applications is incorporated by reference herein.

FIELD

The present disclosure relates to an optical system, to a test device, to a lithography apparatus having such an optical system, to an arrangement comprising such an optical system having a test device, to a method for checking a function of an electronics unit of an optics module and to a method for producing an optical system.

BACKGROUND

Microlithography is used for producing microstructured component parts, such as for example integrated circuits. The microlithography process is performed using a lithography apparatus, which has an illumination system and a projection system. The image of a mask (reticle) illuminated by way of the illumination system is in this case projected by way of the projection system onto a substrate, for example a silicon wafer, which is coated with a light-sensitive layer (photoresist) and arranged in the image plane of the projection system, in order to transfer the mask structure to the light-sensitive coating of the substrate.

Driven by the desire for ever smaller structures in the production of integrated circuits, EUV lithography apparatuses that use light having a wavelength in the range from 0.1 nm to 30 nm, such as 13.5 nm, are currently under development. Since most materials absorb light of this wavelength, EUV lithography apparatuses typically use reflective optics, that is to say mirrors, instead of—as previously—refractive optics, that is to say lenses. Furthermore, beam guidance in EUV lithography apparatuses usually takes place in a vacuum, since the EUV radiation would be greatly attenuated when propagating in a gas atmosphere. The EUV lithography apparatus therefore has one or more vacuum housings. EUV lithography apparatuses are therefore of considerably more complex structure than lithography apparatuses whose working light has a higher wavelength.

Some electronics, such as for example actuation electronics for actuable optical elements, are arranged in a vacuum housing of the lithography apparatus due to the system design. The electronics themselves are in this case typically accommodated in a vacuum-tight housing, since the electronics are not designed for operation under vacuum, but rather use atmospheric pressure, for example. Cable connections are usually used to transmit signals from a control computer outside the vacuum housing to the electronics. The cable connection is in this case guided via multiple sections and plug connectors, such as for example via a vacuum interface on the vacuum housing and a further interface on the vacuum-tight housing of the electronics. Multiple cable bundles often are connected via respective plug connectors in this case. It may be the case here that individual contacts are not produced correctly, that one of the plug connectors breaks when connected or that two plug connectors are mixed up. All this may lead to the electronics possibly not operating as intended. This may be followed by burdensome troubleshooting.

During operation of electronics arranged in the vacuum housing, it is to be borne in mind here that it is not possible to dissipate heat through convection. The electronics therefore have to be cooled in another way, for example by way of a water cooling system. However, integrating the water cooling system when constructing the lithography apparatus can be highly burdensome. The lithography apparatus is typically already in a high state of integration when the water cooling system is able to be put into operation. Since the water cooling system is operational for the operation of the electronics, a first system test, in which for example correct cabling and wiring of the electronics is checked, is usually able to take place only at this later time when the lithography apparatus is constructed. If a defect is identified in this system test, then the lithography apparatus usually has to be dismantled again from the high state of integration in order to rectify the defect, which is highly burdensome.

SUMMARY

The present disclosure seeks to provide an improved optical system.

In an aspect, the disclosure proposes an optical system having a number of optics modules. A respective optics module has:

- a number of displaceable optical elements for guiding radiation in the optical system,
- a number of actuator/sensor devices, wherein at least one of the actuator/sensor devices is assigned to the respective optical element, wherein the respective actuator/sensor device is configured to displace the assigned optical element and/or to acquire a position of the assigned optical element,
- a vacuum-tight housing, and
- an electronics unit arranged in the vacuum-tight housing and configured to actuate the respective actuator/sensor device on the basis of received actuation data, wherein the electronics unit has a first electronics region containing a number of electrical and/or electronic component parts and that generates, during operation, a first thermal power loss that is less than or equal to a predetermined threshold value, and a second electronics region containing a number of electrical and/or electronic component parts and that generates, during operation, a second thermal power loss above the predetermined threshold value, and wherein the first electronics region is able to be operated independently of the second electronics region.

Due to the division of the electronics unit of a respective optics module into a first and a second electronics region having the respective thermal power loss, the first electronics region is able to be operated in any state of integration of the optical system, for example during production of the optical system, for test purposes. It is thus possible to check both the function of the electronics unit and an interface via which the actuation data are transmitted before the electronics unit is integrated deep into the optical system. The electronics unit or the optics module for example do not have to be actively cooled as long as only the first electronics region is operated. The test mode can be performed using a test device, as described with reference to the second aspect.

The optical system forms for example a projection exposure apparatus, such as for EUV lithography, or forms a subsystem of a projection exposure apparatus, such as a beamforming and exposure system or an imaging system. The projection exposure apparatus may be an EUV lithography apparatus. EUV stands for "extreme ultraviolet" and denotes a wavelength of the working light of between 0.1 nm and 30 nm. The projection exposure apparatus may also be a DUV lithography apparatus. DUV stands for "deep ultraviolet" and denotes a wavelength of the working light of between 30 nm and 250 nm.

The optical elements are for example arranged outside the vacuum-tight housing. The optical elements may be for example mirrors, such as micromirrors, that is to say mirrors having a side length of less than 1 mm, or lenses and/or optical gratings and/or filters. A respective optical component part is able to be displaced by way of the assigned actuator/sensor device and/or a position of the optical element may be acquired by way of the actuator/sensor device. The position information may be processed in order to control and/or regulate the respective optical element and/or the optics module.

The optics module is designed for example as a multi-mirror arrangement, such as a micromirror array (MMA). Such an arrangement may comprise more than 100, such as more than 1000, as an example more than 10,000, for example more than 100,000 individually actuable mirrors. These may be mirrors for reflecting EUV radiation.

The fact that the optical elements are configured to guide radiation is understood to mean for example that the respective optical element is configured to manipulate the radiation, for example by deflecting or diverting the radiation through reflection or refraction. The respective optical component part may also modify or influence other properties of the radiation, such as a polarization, a phase and/or a wavelength.

The optical system comprises a number of optics modules. The number comprises an amount greater than or equal to one. In other words, the optical system may comprise exactly one optics module or may also comprise two optics modules or more than two optics modules. The optical system furthermore comprises at least one optical module, for example further optical elements.

The vacuum-tight housing is configured to receive the electronics unit and to keep it under atmospheric pressure, even when the optics module is installed in a vacuum housing. Atmospheric pressure is understood here to mean for example a pressure range of 10 hectoPascals (hPa)—10,000 hPa. The vacuum-tight housing may be filled, during operation of the optics module, with a specific gas, such as for example nitrogen, carbon dioxide or argon, or else a mixture of multiple gases, such as air. The vacuum-tight housing may consist of metal.

The electronics unit is configured to actuate the actuator/sensor devices of the optics module. The electronics unit is implemented for example in hardware form for this purpose. If the implementation is in hardware form, the electronics unit may be embodied as a system or as part of a system, for example as a computer or as a microprocessor or as a control computer or as an embedded system.

The actuation data are transmitted for example from a control computer external to the optics module to the respective electronics unit in the form of electrical signals via a wired interface. The term electrical signals is understood here to mean digital or else analogue electrical signals, wherein an operating voltage by way of which energy is provided for the operation of the optics module and/or of the electronics unit also constitutes an electrical signal. The electrical signal may comprise a data signal, which may comprise a control signal for actuating the optics module, for example the actuator/sensor devices, or else a measured data signal from the actuator/sensor devices.

The electrical signals are transmitted to the electronics unit for example via a wired interface. The term "interface" is understood here for example to mean the entire signal transmission path from a respective external unit to the electronics unit. The interface thus comprises a number of cable bundles, plug connectors and the like. The interface may have a constant multiplicity of electrical lines running in parallel along its course. In some embodiments, the interface may however also have, in sections, a different multiplicity of electrical lines running in parallel; by way of example, an individual operating voltage line in a plug connector may be placed onto a multiplicity of contact pins of the plug connector.

The interface comprises, in sections, for example up to 100 parallel electrical lines, or up to 400 parallel electrical lines, or even up to 1000 parallel electrical lines.

The interface comprises at least one first bundle containing a multiplicity of electrical lines, which first bundle is able to be coupled to corresponding contacts of the electronics unit. The first bundle thus forms a first section of the interface, wherein the interface may be extended by further sections, for example by respective further bundles. The multiplicity of electrical lines may be arranged in one or in multiple cables. In other words, the respective bundle may comprise more than one cable with in each case one or more electrical lines. The bundle may additionally have, on one side, multiple separate plug connectors for connection to the electronics unit or to a further bundle. The contacts of the electronics unit are arranged for example in one or more plug connectors on the electronics unit. The one or more plug connectors may in this case be designed as sockets or as plugs. The first bundle has for example the respectively matching socket(s) and/or plug(s) on one end.

The respective electronics region comprises a respective number of electrical and/or electronic components, such as for example resistors, capacitors, coils, diodes, transistors and/or logic gates. The first electronics region has for example a rudimentary functionality. This comprises for example measuring a temperature, querying memory contents and/or executing basic input/output functions.

The second electronics region can comprise signal processing logic and power electronics that provide the operating voltage used for the operation of the actuator/sensor devices, such as in the form of a modulated actuation voltage. The signal processing logic is configured to process the actuation data. The signal processing logic therefore forms for example a control and regulation circuit for the actuator/sensor devices.

The threshold value for the thermal power loss can be selected such that the first thermal power loss is dissipated, without active cooling of the electronics unit or of the optics module, solely via heat transfer in solid bodies and/or thermal radiation. In other words, no active cooling is used for the operation of the first electronics region. The first electronics region may therefore already be operated for test purposes when an active cooling system, such as a fluid cooling system, is not yet provided and/or operational. The test mode makes it possible to check whether the signal transmission via the interface is operating correctly. It may furthermore also be checked in the test mode whether a transmission quality of data signals is good enough for active operation of the optics module, that is to say for example has a sufficient signal strength. The threshold value for the thermal power loss is for example 10 W, such as 5 W, as an example 2 W, for example 1 W.

The fact that the first electronics region is able to be operated independently of the second electronics region is understood to mean that the first electronics region is able to be operated without the second electronics region being operated. This may refer to a test mode of the first electronics region in which, as explained above, a correct function of the interface for connecting the electronics unit and/or simple system tests prior to the integration of the electronics unit into the optics module or the optics module into the optical system (for example so-called "dead-on-arrival" test) are performed. During such a test mode of the first electronics region, the second electronics region remains for example voltage-free and deactivated. The second electronics region thus does not generate any thermal power loss that would need to be dissipated by way of an active cooling system, while the electronics unit and the optics module withstand the thermal power loss of the first electronics region continuously, even without an active cooling system.

It is pointed out that the second electronics region may likewise be operated independently of the first electronics region, but this is not necessarily the case. During regular operation of the optical system, operation of the first electronics region is optional. This is dependent on whether the first electronics region provides functions relevant for regular operation, or whether the functionality thereof is restricted to the connection and function tests described above during integration of the optical system.

In some embodiments, the first electronics region is designed solely to perform connection and function tests. In this embodiment, the first electronics region does not have any functionality that is used during normal operation of the optical system. The second electronics region may likewise comprise the functionality of the first electronics region, such that, during regular operation in which only the second electronics region is operated, it is possible to perform the connection and function tests by way of the second electronics region.

In further embodiments, the first electronics region is formed on a separate circuit board to the second electronics region.

According to one embodiment of the optical system, the respective optics module is arranged in a vacuum housing of the optical system, and the first electronics region is able to be operated continuously without active cooling of the electronics unit and/or of the optics module.

In other words, the first thermal power loss below the predetermined threshold value, without active cooling of the electronics unit and/or of the optics module, is able to be dissipated solely by guiding thermal radiation away from the electronics unit. This is the case for example when an ambient temperature of the electronics unit, of the optics module or else of the vacuum housing of the optical system is in a region conventional for the operation of such systems, that is to say for example between 10° C.-40° C. or else between 0° C.-60° C.

In this embodiment, the first thermal power loss is transferred, for example continuously and in full, by way of thermal radiation from the optics module to the vacuum housing via the vacuum in the vacuum housing.

According to an embodiment of the optical system, active cooling of the electronics unit and/or of the optics module is used for the operation of the second electronics region, wherein the respective optics module has a fluid cooling circuit that is coupled to a fluid cooling system of the optical system during operation of the optical system in order to dissipate the second thermal power loss of the second electronics region.

In other words, the second thermal power loss above the predetermined threshold value uses active cooling of the electronics unit and/or of the optics module.

Operation of the optical system is understood here for example to mean operative regular operation, for example as part of exposing wafers in the production of integrated circuits with a lithography apparatus. Exclusive operation of the first electronics region is for example not a mode of the optical system. If only the first electronics region is operated, this may be referred to for example as a test mode of the electronics unit or of the optics module.

According to an embodiment of the optical system, the first electronics region and the second electronics region of a respective optics module are physically separate from one another.

Physically separate from one another means for example that the first electronics region and the second electronics region form separate regions of the electronics unit from one another. By way of example, the regions are integrated at different spatial positions of a circuit board of the electronics unit and/or on different circuit boards. In some embodiments, there is no electrical connection between the first and the second electronics region. In some embodiments, there is a switchable electrical connection between the first and the second electronics region, wherein the electrical connection is interrupted in the case of exclusive operation of the first electronics region, and may be closed during regular operation of the optical system.

In embodiments, the first and the second electronics region have common components, such as for example a common signal input, common electrical lines and the like. The first electronics region and the second electronics region are for example able to be addressed via the same interface, in other words, the interface transmits the electrical signals both for the first electronics region and for the second electronics region. The interface may in this case have separate electrical lines for the respective electronics region, or else have common electrical lines for both electronics regions. Provision may also be made for the electronics unit to comprise a multiplexing unit that is configured to selectively connect a respective electrical line of the interface to the first electronics region or to the second electronics region. The multiplexing unit is configured here, in a test mode of the electronics unit in which only the first electronics region is operated, to connect the respective electrical lines to the first electronics unit.

In an embodiment, the first electronics region is a subregion of the second electronics region. Also in this embodiment, the first and second electronics region may be physically separate. However, a logic separation may also be present, wherein for example a controller of the electronics unit is designed or configured, in a test mode of the electronics unit, such that only the components of the first electronics region are "seen" and are able to be addressed by the controller. The controller in this example is part of the first electronics region. During regular operation of the optical system, the controller may however also have other functions, and for example additionally address components of the second electronics region. The controller then therefore also forms part of the second electronics region.

According to an embodiment of the optical system, the respective first electronics region has a multiplicity of electrical and/or electronic component parts, wherein a sum of the thermal power losses of the component parts during operation is less than or equal to the predetermined threshold value.

In this embodiment, all of the component parts of the first electronics region may for example be operated simultaneously and continuously without the threshold value for the thermal power loss being exceeded.

According to an embodiment of the optical system, the respective first electronics region has a multiplicity of electrical and/or electronic component parts, wherein a respective subset of the multiplicity of component parts is able to be operated selectively, and wherein the respective subset is selected such that a sum of the thermal power losses of the respective subset is less than or equal to the predetermined threshold value.

In this embodiment, in each case only a selection of the component parts of the first electronics region is operated simultaneously, so that the threshold value for the thermal power loss is not exceeded. In a selective operating mode, only the respectively selected subset of the component parts is thus operated selectively, without the remaining component parts of the multiplicity.

This means that, in a test mode of the electronics unit or of the optics module, multiple functions may be provided, these having a total thermal power loss above the threshold value.

According to an embodiment of the optical system, the number of electrical and/or electronic component parts of the first electronics region comprises a storage unit for storing operating parameters for the operation of the optical system, a temperature monitoring unit for monitoring a temperature of the first electronics region and/or an identification unit for determining a hardware version and/or a software version of the respective optics module and/or of elements of the optics module.

According to an embodiment of the optical system, the respective electronics unit has a processor that is assigned to the first electronics region or to the second electronics region on the basis of a respective operating mode of the processor, wherein the processor is able to be operated in a first operating mode in which the thermal power loss of the processor is less than or equal to the predetermined threshold value and in which the processor is assigned to the first electronics region, and wherein the processor is able to be operated in a second operating mode in which the thermal power loss of the processor is greater than the predetermined threshold value and in which the processor is assigned to the second electronics region.

According to an embodiment of the optical system, the respective second electronics region has power electronics for providing an operating power in order to operate the respective actuator/sensor device and/or a processor for determining actuation and/or control signals for the respective actuator/sensor device on the basis of the received actuation data and/or received sensor signals.

According to an embodiment of the optical system, the respective electronics unit has different, dedicated connection elements for connecting the first electronics region and for connecting the second electronics region, wherein the respective connection element is configured to transmit electrical signals comprising the actuation data and/or analogue and/or digital data signals and to provide an operating voltage for the operation of the respective electronics region.

The respective connection element is for example an electrical line that ends in a contact pin of a socket or of a plug, to which socket or plug the bundle of electrical lines of the interface is coupled.

The operating voltage for the first and the second electronics region may be of differing magnitude. The respective electronics region may furthermore use multiple operating voltages for operation; the second electronics region, in order to actuate the actuator/sensor devices, may for example use a higher operating voltage than an operating voltage for a processor or the like, for example a voltage of up to 30 V, up to 60 V or even up to 120 V.

According to an embodiment of the optical system, the respective electronics unit has a common connection element for connecting the first electronics region and for connecting the second electronics region, wherein the common connection element is configured to transmit electrical signals comprising the actuation data and/or analogue and/or digital data signals and to provide an operating voltage for the operation of both electronics regions.

The connection element is for example a socket or a plug of the electronics unit and forms part of a plug connector.

According to an embodiment of the optical system, the respective common connection element for transmitting the electrical signals comprises a number of electrical lines, wherein the respective electrical line is configured, during operation of the optical system, to transmit electrical signals for the respective first electronics region and for the respective second electronics region, and wherein a respective switching element for selectively interrupting the electrical line from the second electronics region is arranged in the respective electrical line.

Reference may also be made here to a daisy-chained electrical line, wherein the line to the second electronics region may be interrupted by the switching element. The switching element comprises for example a transistor or an electronic and/or electromechanical relay.

According to a second aspect, the disclosure proposes a test device for checking a function of an electronics unit of an optics module of an optical system according to the first aspect. The test device has:

- a plug connector for connecting the test device to the respective electronics unit,
- a test mode unit for selectively actuating the first electronics region, such that only the first electronics region is operated, without the second electronics region, and
- a determination unit for determining whether the first electronics region has an intended function.

This test device can be used to check a function of the respective electronics unit of the respective optics module of the optical system according to the first aspect. The respective test may in this case be performed multiple times and in different states of integration of the optical system. By way of example, the electronics unit may first of all be tested on its own, then the electronics unit integrated into the vacuum-tight housing of the optics module, and then once again when the optics module is installed in a vacuum housing of the optical system.

The test device may be used both to check the function of the electronics unit, for example of the first electronics region, and to check the signal transmission to the electronics unit, which is provided for example via an interface with one or more bundles of electrical lines.

The test device is implemented at least partially in hardware form. The plug connector is for example designed in the form of hardware. The test operating unit and the determination unit may each be implemented in the form of hardware and/or software. In the case of an implementation in the form of hardware, the respective unit may be designed for example as a computer or as a microprocessor. In the case of an implementation in the form of software, the respective unit may be designed as a computer program product, as a function, as a routine, as an algorithm, as part of a program code or as an executable object.

The test mode unit is configured for example to provide an operating voltage for operating the first electronics region. For this purpose, the test mode unit may comprise a current source and/or voltage source.

The determination unit is configured for example to transmit test signals or the like to the electronics unit. The test signals may in this case comprise data signals that prompt the first electronics region or a component of the first electronics region to execute a specific function or the like. The specific function comprises for example outputting stored information and/or performing a logic operation on the basis of the test signal, and outputting a result of the logic operation. The test signal may also prompt reading of a sensor, such as a temperature sensor. In other words, the determination unit is configured to receive response signals from the first electronics region.

The determination unit may furthermore be configured, on the basis of the transmitted test signals and the corresponding received response signals, to check the signal transmission path, which is provided for example by way of a corresponding interface. In other words, the determination unit determines for example an intended function of the first electronics region, but at the same time determines a defect in an electrical line of the interface.

In some embodiments, the test device is additionally configured to check an interface to the electronics unit. The interface comprises a bundle containing a multiplicity of electrical lines. This function may also be provided without a test mode of the first electronics region. For this purpose, the test device comprises for example a generation unit, which is configured to generate an electrical test signal for checking a pair of electrical lines, an acquisition unit, which is configured to acquire a response signal when the test signal is applied to the pair of electrical lines, a multiplexing unit for connecting a respective pair of electrical lines of the bundle to the generation unit and the acquisition unit, and a comparison unit for comparing the acquired response signal for the pair of electrical lines with a response signal predetermined for the pair, and wherein the determination unit is configured to determine, on the basis of the comparison, whether there is a defect in one of the electrical lines of the pair.

In this embodiment, the test device may be used to determine a passive input behaviour of an interface via which the electronics unit of the optics module is connected and thus check whether the electrical lines of the interface are intact.

The electrical test signal comprises a DC voltage signal for determining an electrical resistance, an AC voltage signal with a specific frequency for determining a specific impedance and/or an AC voltage signal with a changeable frequency for determining an impedance characteristic. Spectral analysis may be able to be performed on the basis of the electrical test signal.

The electrical test signal may have different signal shapes, such as when it is an AC voltage signal. Examples of these are a sinusoidal signal profile, a square-wave signal profile, a sawtooth signal profile or even a triangular-wave signal profile. The AC voltage signal may be shifted with respect to a zero potential.

The DC voltage signal may be temporally modulated. For example, the DC voltage signal may consist of an overlap between a constant voltage value and an AC voltage signal.

The test device can be designed as a hand-held device that is mobile and ready for use with little effort. By way of example, the test device is designed as a stand-alone test device that comprises an integrated battery for supplying power to the test device.

The test device can have an output unit by way of which a respective determination result is output to a user and/or to a control computer. The output unit may comprise a display device that is integrated in the test device, such as a flat screen, or a communication interface. The communication interface may be designed in wired or else wireless form.

The test device furthermore can have a control unit that is configured to control the test device. By way of example, the control unit controls the test mode unit and the determination unit. As an alternative, the test device may also be able to be controlled by an external control unit, wherein the external control unit is for example connected to the test device in terms of communication via a communication interface.

According to a third aspect, the disclosure proposes a lithography apparatus having an optical system according to the first aspect.

According to a fourth aspect, the disclosure proposes an arrangement having an optical system according to the first aspect and having a test device according to the second aspect.

The test device can be connected to electronics unit of an optics module of the optical system in order to check the function of the electronics unit.

Optionally, the optical system in this arrangement is currently being constructed, that is to say is not yet fully ready for operation. By way of example, the optical system is in a number of individual parts that are constructed or integrated step-by-step to form the finished optical system. A water cooling system used for the operation of the respective second electronics region is for example not yet integrated and/or ready for operation.

According to a further aspect, the disclosure proposes a method for checking an interface for the wired transmission of electrical signals to an electronics units, arranged in a vacuum-tight housing, of an optics module. The optics module has a number of displaceable optical elements for guiding radiation, wherein at least on actuator/sensor device for displacing the optical element and/or for acquiring a position of the optical element is assigned to the respective optical element, wherein the electronics unit is configured to actuate the respective actuator/sensor device on the basis of electrical signals received via the interface. The interface comprises at least one first bundle containing a multiplicity of electrical lines, which first bundle is able to be coupled to corresponding contacts of the electronics unit. The method comprises the steps of:

coupling the first bundle to the electronics unit, connecting a test device to a free end of the first bundle, applying an electrical test signal generated by the test device to a specific pair of electrical lines of the first bundle acquiring an electrical response signal from the specific pair of electrical lines, comparing the acquired response signal with a response signal predetermined for the specific pair, and determining whether a defect is present in one of the electrical lines of the pair on the basis of the comparison.

According to one embodiment of the method, the electronics unit of the optics module has a first electronics region containing a number of electrical and/or electronic component parts and that generates, during operation, a thermal power loss that is less than or equal to a predetermined threshold value, and a second electronics region containing a number of electrical and/or electronic component parts and that generates, during operation, a second thermal power loss above the predetermined threshold value, and wherein the first electronics region is able to be operated independently of the second electronics region. The method furthermore comprises:

operating the first electronics region, and checking an intended function of the first electronics region.

According to a fifth aspect, the disclosure proposes a method for checking a function of an electronics unit of an optics module. The optics module has: a number of displaceable optical elements for guiding radiation in the optical system, a number of actuator/sensor devices, wherein at least one of the actuator/sensor devices is assigned to the respective optical element, wherein the respective actuator/sensor device is configured to displace the assigned optical element and/or to acquire a position of the assigned optical element, and a vacuum-tight housing. The electronics unit is able to be arranged in the vacuum-tight housing and the electronics unit is configured to actuate the respective actuator/sensor device on the basis of received actuation data, wherein the electronics unit has a first electronics region containing a number of electrical and/or electronic component parts and that generates, during operation, a first thermal power loss that is less than or equal to a predetermined threshold value, and a second electronics region containing a number of electrical and/or electronic component parts and that generates, during operation, a second thermal power loss above the predetermined threshold value. The method comprises the steps of:

coupling the electronics unit and/or the optics module to a test device, operating the first electronics region, without the second electronics region being operated, and checking an intended function of the first electronics region.

An optics module of the optical system according to the first aspect and the test device according to the second aspect are for example used.

In the method, for example only the first electronics region is operated. In other words, the second electronics region is not operated, that is to say for example remains voltage-free and deactivated.

The embodiments and features described for the optical system and the optics module of the optical system and the test device apply correspondingly to the proposed method, and vice versa.

According to a sixth aspect, the disclosure proposes a method for producing an optical system having a number of optics modules. The respective optics module comprises the components: a number of displaceable optical elements for guiding radiation in the optical system, a number of actuator/sensor devices, wherein the respective actuator/sensor device is configured to displace the optical element and/or to acquire a position of the optical element, wherein at least one of the actuator/sensor devices is assigned to the respective optical element, a vacuum-tight housing, and an electronics unit able to be arranged in the vacuum-tight housing and configured to actuate the respective actuator/sensor device on the basis of received actuation data, wherein the electronics unit has a first electronics region containing a number of electrical and/or electronic component parts and that generates, during operation, a first thermal power loss that is less than or equal to a predetermined threshold value, and a second electronics region containing a number of electrical and/or electronic component parts and that generates, during operation, a second thermal power loss above the predetermined threshold value. The method comprises the steps of:

providing the components of the optics module, checking the function of the electronics unit using the method according to the fifth aspect, and integrating the optics module when the function of the electronics unit is present.

The optical system according to the first aspect can be produced using this method.

The embodiments and features described for the optical system apply correspondingly to the proposed method, and vice versa.

"Integrating the optics module" is understood here to mean that the optics module is assembled or constructed from its individual components.

According to one embodiment of the method, the second step "checking the function of the electronics unit" is additionally performed after the optics module has been integrated.

According to an embodiment of the method, the integrated optics module is integrated into a vacuum housing of the optical system, and the second step "checking the function of the electronics unit" is performed in relation to the optics module integrated in the vacuum housing, wherein the electronics unit is connected to the test device via an interface comprising a multiplicity of bundles containing multiple electrical lines. The interface comprises for example a vacuum interface integrated in the vacuum housing and a vacuum interface integrated in the vacuum-tight housing.

In this embodiment, it may additionally be checked whether the interface provides an intended function.

According to an embodiment of the method, the second step "checking the function of the electronics unit" is performed without a fluid cooling circuit of the optics module being coupled to a fluid cooling system of the optical system and/or being operated, wherein the fluid cooling circuit is configured, during operation of the optical system, to dissipate the second thermal power loss of the second electronics region.

"A" or "an" in the present case should not necessarily be understood to be restrictive to exactly one element. Rather, a plurality of elements, such as, for example, two, three or more, may also be provided. Any other numeral used here, too, should not be understood to the effect that there is a restriction to exactly the stated number of elements. Rather, numerical deviations upwards and downwards are possible, unless indicated to the contrary.

Further possible implementations of the disclosure also comprise not explicitly mentioned combinations of any features or embodiments that are described above or below with respect to the exemplary embodiments. In this case, a person skilled in the art will also add individual aspects as improvements or supplementations to the respective basic form of the disclosure.

Further refinements and aspects of the disclosure are the subject matter of the dependent claims and also of the exemplary embodiments of the disclosure that are described below.

The disclosure is explained in greater detail below on the basis of embodiments with reference to the appended figures.

DETAILED DESCRIPTION

Unless indicated otherwise, elements that are identical or functionally identical have been given the same reference signs in the figures. It should also be noted that the illustrations in the figures are not necessarily true to scale.

Figure 1:
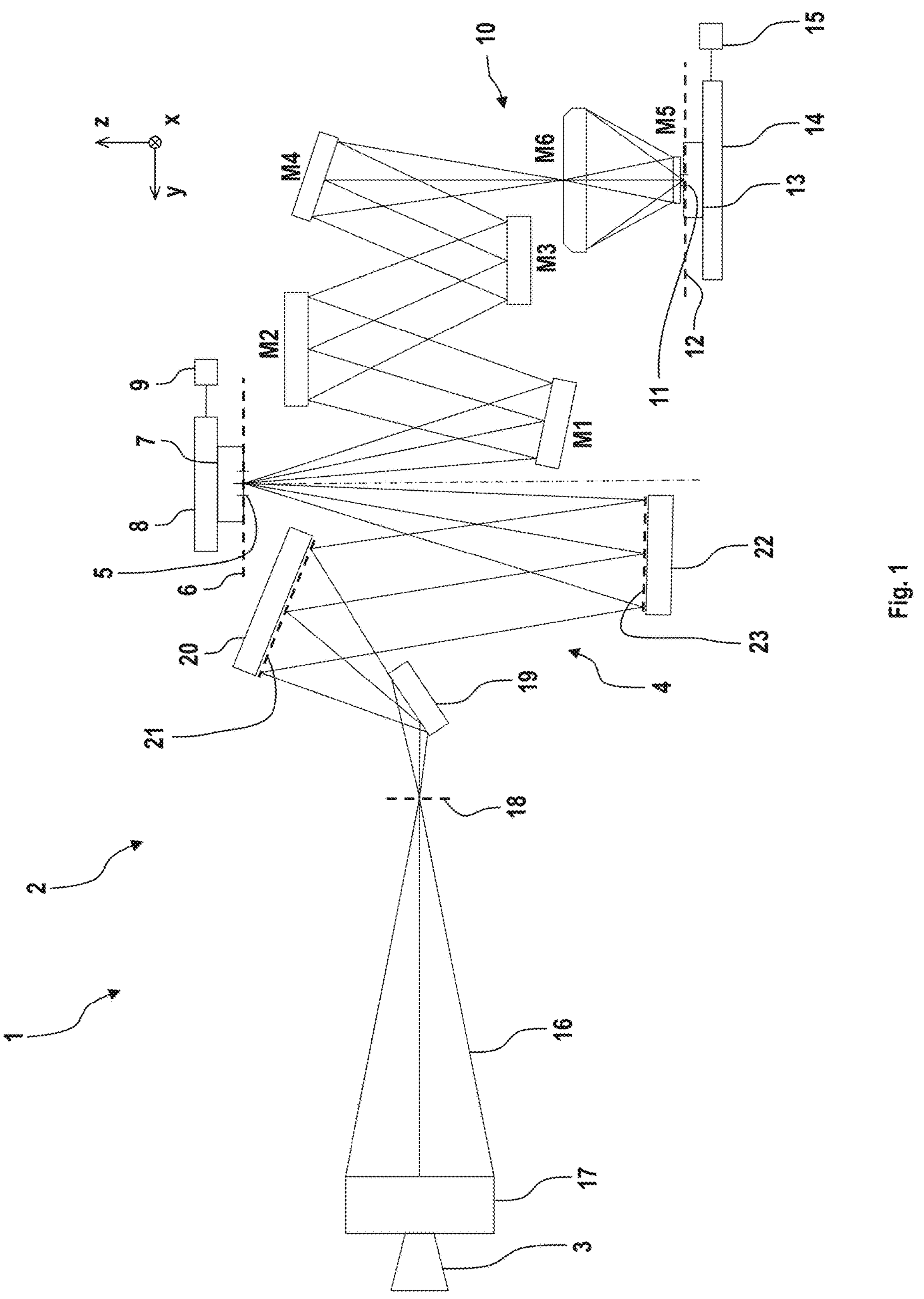
FIG. 1 shows a schematic meridional section of a projection exposure apparatus for EUV projection lithography.

FIG. 1 shows an embodiment of a projection exposure apparatus 1 (lithography apparatus), for example an EUV lithography apparatus. One embodiment of an illumination system 2 of the projection exposure apparatus 1 has, in addition to a light or radiation source 3, an illumination optical unit 4 for illuminating an object field 5 in an object plane 6. In an alternative embodiment, the light source 3 may also be provided as a module separate from the rest of the illumination system 2. In this case, the illumination system 2 does not comprise the light source 3.

A reticle 7 arranged in the object field 5 is exposed. The reticle 7 is held by a reticle holder 8. The reticle holder 8 is displaceable by way of a reticle displacement drive 9, for example in a scanning direction.

FIG. 1 shows, for explanatory purposes, a Cartesian coordinate system with an x-direction x, a y-direction y and a z-direction z. The x-direction x runs perpendicularly into the plane of the drawing. The y-direction y runs horizontally, and the z-direction z runs vertically. The scanning direction in FIG. 1 runs along the y-direction y. The z-direction z runs perpendicularly to the object plane 6.

The projection exposure apparatus 1 comprises a projection optical unit 10. The projection optical unit 10 serves for imaging the object field 5 into an image field 11 in an image plane 12. The image plane 12 extends parallel to the object plane 6. Alternatively, an angle between the object plane 6 and the image plane 12 that differs from 0° is also possible.

A structure on the reticle 7 is imaged onto a light-sensitive layer of a wafer 13 arranged in the region of the image field 11 in the image plane 12. The wafer 13 is held by a wafer holder 14. The wafer holder 14 is displaceable by way of a wafer displacement drive 15, for example along the y-direction y. The displacement, on the one hand, of the reticle 7 by way of the reticle displacement drive 9 and, on the other hand, of the wafer 13 by way of the wafer displacement drive 15 may take place in such a way as to be synchronized with one another.

The light source 3 is an EUV radiation source. The light source 3 emits, for example, EUV radiation 16, which is also referred to below as used radiation, illumination radiation or illumination light. For example, the used radiation 16 has a wavelength in the range between 5 nm and 30 nm. The radiation source 3 may be a plasma source, for example an LPP (laser produced plasma) source or a DPP (gas-discharge produced plasma) source. It may also be a synchrotron-based radiation source. The light source 3 may be an FEL (free-electron laser).

The illumination radiation 16 emerging from the light source 3 is focused by a collector 17. The collector 17 may be a collector with one or more ellipsoidal and/or hyperboloidal reflection surfaces. The at least one reflection surface of the collector 17 may be impinged upon by the illumination radiation 16 with grazing incidence (GI), that is to say with angles of incidence greater than 45°, or with normal incidence (NI), that it is say with angles of incidence less than 45°. The collector 17 may be structured and/or coated, firstly, for optimizing its reflectivity for the used radiation and, secondly, for suppressing extraneous light.

Downstream of the collector 17, the illumination radiation 16 propagates through an intermediate focus in an intermediate focal plane 18. The intermediate focal plane 18 may represent a separation between a radiation source module, having the light source 3 and the collector 17, and the illumination optical unit 4.

The illumination optical unit 4 comprises a deflection mirror 19 and, arranged downstream thereof in the beam path, a first facet mirror 20. The deflection mirror 19 may be a plane deflection mirror or, alternatively, a mirror with a beam-influencing effect that goes beyond the purely deflecting effect. Alternatively or in addition, the deflection mirror 19 may be in the form of a spectral filter which separates a used light wavelength of the illumination radiation 16 from extraneous light with a wavelength deviating therefrom. If the first facet mirror 20 is arranged in a plane of the illumination optical unit 4 that is optically conjugate to the object plane 6 as a field plane, it is also referred to as a field facet mirror. The first facet mirror 20 comprises a multiplicity of individual first facets 21, which may also be referred to as field facets. Only some of these first facets 21 are shown in FIG. 1 by way of example.

The first facets 21 may be embodied as macroscopic facets, for example as rectangular facets or as facets with an arcuate edge contour or an edge contour of part of a circle. The first facets 21 may be embodied as plane facets or, alternatively, as facets with convex or concave curvature.

As known for example from DE 10 2008 009 600 A1, the first facets 21 themselves may also be composed in each case of a multiplicity of individual mirrors, for example a multiplicity of micromirrors. The first facet mirror 20 may for example be designed as a microelectromechanical system (MEMS system). For details, reference is made to DE 10 2008 009 600 A1.

Between the collector 17 and the deflection mirror 19, the illumination radiation 16 travels horizontally, that is to say along the y-direction y.

In the beam path of the illumination optical unit 4, a second facet mirror 22 is arranged downstream of the first facet mirror 20. If the second facet mirror 22 is arranged in a pupil plane of the illumination optical unit 4, it is also referred to as a pupil facet mirror. The second facet mirror 22 may also be arranged at a distance from a pupil plane of the illumination optical unit 4. In this case, the combination of the first facet mirror 20 and the second facet mirror 22 is also referred to as a specular reflector. Specular reflectors are known from US 2006/0132747 A1, EP 1 614 008 B1, and U.S. Pat. No. 6,573,978.

The second facet mirror 22 comprises a plurality of second facets 23. In the case of a pupil facet mirror, the second facets 23 are also referred to as pupil facets.

The second facets 23 may likewise be macroscopic facets, which may for example have a round, rectangular or hexagonal boundary, or may alternatively be facets composed of micromirrors. In this regard, reference is likewise made to DE 10 2008 009 600 A1.

The second facets 23 may have plane reflection surfaces or, alternatively, reflection surfaces with convex or concave curvature.

The illumination optical unit 4 consequently forms a doubly faceted system. This basic principle is also referred to as a fly's eye integrator.

It may be advantageous to arrange the second facet mirror 22 not exactly in a plane that is optically conjugate to a pupil plane of the projection optical unit 10. For example, the second facet mirror 22 may be arranged so as to be tilted in relation to a pupil plane of the projection optical unit 10, as is described for example in DE 10 2017 220 586 A1.

With the aid of the second facet mirror 22, the individual first facets 21 are imaged into the object field 5. The second facet mirror 22 is the last beam-shaping mirror or actually the last mirror for the illumination radiation 16 in the beam path upstream of the object field 5.

In a further embodiment, not shown, of the illumination optical unit 4, a transfer optical unit contributing for example to the imaging of the first facets 21 into the object field 5 may be arranged in the beam path between the second facet mirror 22 and the object field 5. The transfer optical unit may have exactly one mirror, or alternatively have two or more mirrors, which are arranged one behind the other in the beam path of the illumination optical unit 4. The transfer optical unit may for example comprise one or two normal-incidence mirrors (NI mirrors) and/or one or two grazing-incidence mirrors (GI mirrors).

In the embodiment shown in FIG. 1, the illumination optical unit 4 has exactly three mirrors downstream of the collector 17, specifically the deflection mirror 19, the first facet mirror 20 and the second facet mirror 22.

In a further embodiment of the illumination optical unit 4, there is also no need for the deflection mirror 19, and so the illumination optical unit 4 may then have exactly two mirrors downstream of the collector 17, specifically the first facet mirror 20 and the second facet mirror 22.

The imaging of the first facets 21 into the object plane 6 via the second facets 23 or using the second facets 23 and a transfer optical unit is often only approximate imaging.

The projection optical unit 10 comprises a plurality of mirrors Mi, which are consecutively numbered in accordance with their arrangement in the beam path of the projection exposure apparatus 1.

In the example shown in FIG. 1, the projection optical unit 10 comprises six mirrors M1 to M6. Alternatives with four, eight, ten, twelve or any other number of mirrors Mi are similarly possible. The projection optical unit 10 is a twice-obscured optical unit. The penultimate mirror M5 and the last mirror M6 each have a through opening for the illumination radiation 16. The projection optical unit 10 has an image-side numerical aperture that is greater than 0.5 and may also be greater than 0.6, and may be for example 0.7 or 0.75.

Reflection surfaces of the mirrors Mi may be embodied as free-form surfaces without an axis of rotational symmetry. Alternatively, the reflection surfaces of the mirrors Mi may be designed as aspheric surfaces with exactly one axis of rotational symmetry of the reflection surface shape. Just like the mirrors of the illumination optical unit 4, the mirrors Mi may have highly reflective coatings for the illumination radiation 16. These coatings may be designed as multilayer coatings, for example with alternating layers of molybdenum and silicon.

The projection optical unit 10 has a large object-image offset in the y-direction y between a y-coordinate of a centre of the object field 5 and a y-coordinate of the centre of the image field 11. In the y-direction y, this object-image offset may be of approximately the same magnitude as a z-distance between the object plane 6 and the image plane 12.

For example, the projection optical unit 10 may have an anamorphic form. For example, it has different imaging scales $\beta x$, $\beta y$ in the x- and y-directions x, y. The two imaging scales $\beta x$, $\beta y$ of the projection optical unit 10 can be $(\beta x, \beta y)=(+/-0.25, +/-0.125)$. A positive imaging scale $\beta$ means imaging without image inversion. A negative sign for the imaging scale $\beta$ means imaging with image inversion.

The projection optical unit 10 consequently leads to a reduction in size with a ratio of 4:1 in the x-direction x, that is to say in a direction perpendicular to the scanning direction.

The projection optical unit 10 leads to a reduction in size of 8:1 in the y-direction y, that is to say in the scanning direction.

Other imaging scales are likewise possible. Imaging scales with the same sign and the same absolute value in the x-direction x and y-direction y are also possible, for example with absolute values of 0.125 or of 0.25.

The number of intermediate image planes in the x-direction x and in the y-direction y in the beam path between the object field 5 and the image field 11 may be the same or may differ, depending on the embodiment of the projection optical unit 10. Examples of projection optical units with different numbers of such intermediate images in the x- and y-directions x, y are known from US 2018/0074303 A1.

In each case one of the second facets 23 is assigned to exactly one of the first facets 21 for respectively forming an illumination channel for illuminating the object field 5. This may for example produce illumination according to the Köhler principle. The far field is decomposed into a multiplicity of object fields 5 with the aid of the first facets 21. The first facets 21 produce a plurality of images of the intermediate focus on the second facets 23 respectively assigned to them.

By way of an assigned second facet 23, the first facets 21 are in each case imaged onto the reticle 7 in a manner overlaid on one another for the purposes of illuminating the object field 5. Optionally, the illumination of the object field 5 is as homogeneous as possible. It can have a uniformity error of less than 2%. The field uniformity may be achieved by way of the overlay of different illumination channels.

The full-area illumination of the entrance pupil of the projection optical unit 10 may be defined geometrically by an arrangement of the second facets 23. The intensity distribution in the entrance pupil of the projection optical unit 10 may be set by selecting the illumination channels, such as the subset of the second facets 23, which guide light. This intensity distribution is also referred to as illumination setting or illumination pupil filling.

A likewise preferred pupil uniformity in the region of portions of an illumination pupil of the illumination optical unit 4 which are illuminated in a defined manner may be achieved by a redistribution of the illumination channels.

Further aspects and details of the illumination of the object field 5 and for example of the entrance pupil of the projection optical unit 10 are described below.

For example, the projection optical unit 10 may have a homocentric entrance pupil. The latter may be accessible. It may also be inaccessible.

The entrance pupil of the projection optical unit 10 frequently cannot be exactly illuminated with the second facet mirror 22. When imaging the projection optical unit 10, which images the centre of the second facet mirror 22 telecentrically onto the wafer 13, the aperture rays often do not intersect at a single point. However, it is possible to find an area in which the distance of the aperture rays determined in pairs becomes minimal. This area represents the entrance pupil or an area in real space that is conjugate thereto. For example, this area has a finite curvature.

It may be the case that the projection optical unit 10 has different poses of the entrance pupil for the tangential beam path and for the sagittal beam path. In this case, an imaging element, for example an optical component part of the transfer optical unit, should be provided between the second facet mirror 22 and the reticle 7. With the aid of this optical element, the different poses of the tangential entrance pupil and the sagittal entrance pupil may be taken into account.

In the arrangement of the components of the illumination optical unit 4 shown in FIG. 1, the second facet mirror 22 is arranged in an area conjugate to the entrance pupil of the projection optical unit 10. The first facet mirror 20 is arranged so as to be tilted in relation to the object plane 6. The first facet mirror 20 is arranged so as to be tilted in relation to an arrangement plane defined by the deflection mirror 19. The first facet mirror 20 is arranged so as to be tilted with respect to an arrangement plane defined by the second facet mirror 22.

Figure 2:
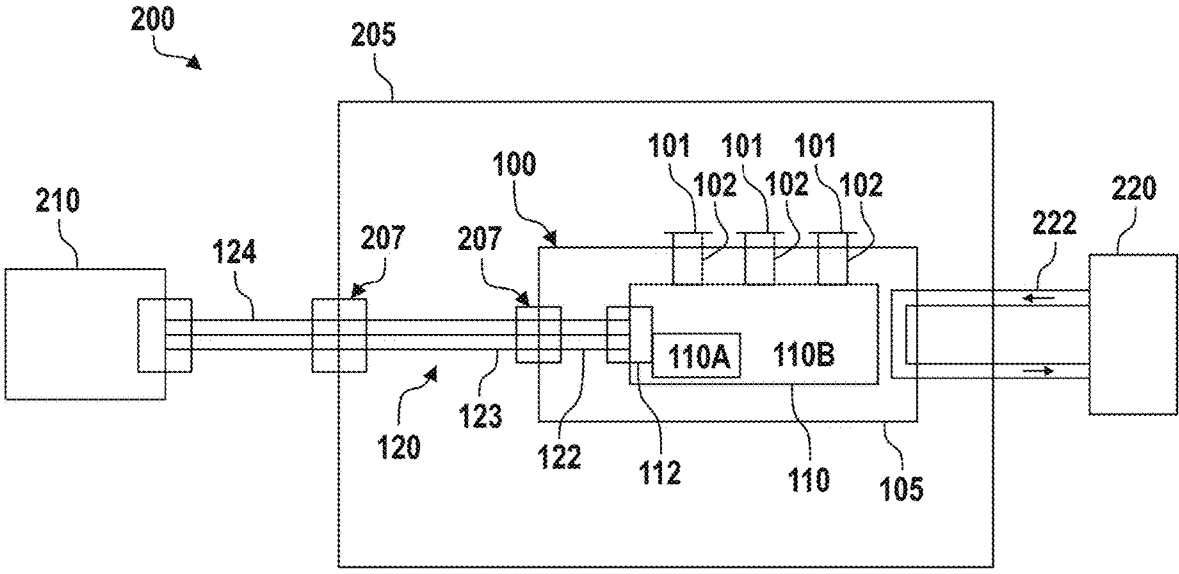
FIG. 2 shows a schematic exemplary embodiment of a ready-for-operation optical system with an optics module.

The projection exposure apparatus 1, the illumination system 2, the illumination optical unit 4 and the projection optical unit 10 are examples of a respective optical system 200 (see FIG. 2). The first facet mirror 20, the second facet mirror 22 or else each of the mirrors M1-M6 are examples of a respective optics module 100 (see FIG. 2-4) of the optical system 200. The individual facets 21, 23 of the facet mirrors 20, 22 are examples of optical elements 101 (see FIG. 2-4) of the optics module 100.

Figure 3:
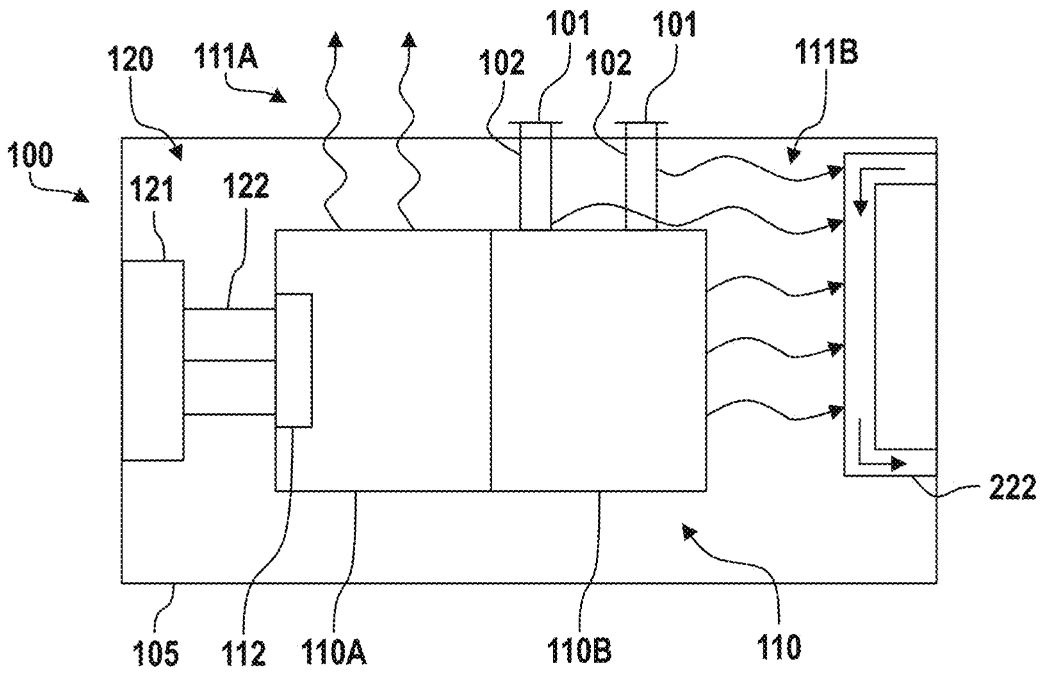
FIG. 3 shows a schematic first exemplary embodiment of an electronics unit having first and second electronics regions.
Figure 4:
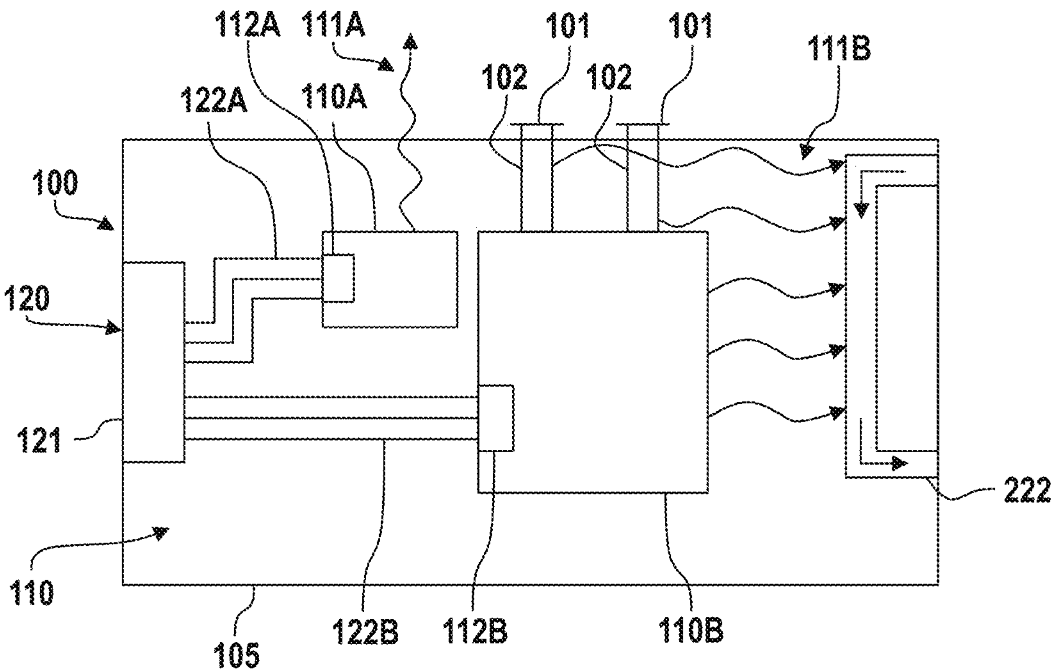
FIG. 4 shows a schematic second exemplary embodiment of an electronics unit having first and second electronics regions.

In order to individually actuate the facets 21, 22 or other displaceable optical elements 101 of the respective optics module 100, a respective optics module 100 has an electronics unit 110 (see FIG. 2-4) and actuator/sensor devices 102 assigned to the optical elements 101 (see FIG. 2-4). Actuation data that are provided by a control computer 201 (see FIG. 2) or the like to the respective optics module 100 in order to control or regulate the position of the individual optical elements 101 are transmitted to the electronics unit 110, for example via a wired interface 120 (see FIG. 2-4). Further details regarding the structure of the optics module 100 and of the electronics unit 110 are explained below with reference to FIG. 2-4.

FIG. 2 shows a schematic exemplary embodiment of a ready-for-operation optical system 200 with an optics module 100. The optical system 200 is for example a projection exposure apparatus or part of one of these, such as an illumination optical unit 4 (see FIG. 1) or a projection optical unit 10 (see FIG. 1). The core element of the optical system 200 is the optics module 100, which is arranged in a vacuum housing 205 of the optical system 200. The optics module 100 has a number of displaceable optical elements 101 for guiding radiation, for example EUV light, in the optical system 200, wherein at least one actuator/sensor device 102 for displacing the optical element 101 and/or for acquiring a position of the optical element 101 is assigned to the respective optical element 101. Without restricting generality, in this example, only three optical elements 101 and only three actuator/sensor devices 102 are illustrated. The optics module 100 forms for example one of the facet mirrors 20, 22 from FIG. 1. It is pointed out that the optical system 200 may have more than just one optics module 100. Further optics modules 100 may have an identical or else a different structure that the optics module 100 illustrated here.

The optics module 100 comprises an electronics unit 110 that is configured to actuate the respective actuator/sensor device 102 on the basis of actuation data received via a wired interface 120. The actuation data are transmitted in the form of electrical signals. The electronics unit 110 is arranged in a vacuum-tight housing 105, wherein the electronics unit 110 is located in a gas atmosphere under for example normal pressure, that is to say around 100 hPa. This makes it possible to use conventional electrical and/or electronic components for the electronics unit 110 instead of ones that are designed specifically for operation in a vacuum. It is thus possible to use comparatively simple and inexpensive production methods to produce the electronics unit 110. The electronics unit 110 has two electronics regions 110A, 110B. The first electronics region 110A comprises a number of electrical and/or electronic component parts and generates, during operation, a first thermal power loss 111A (see FIG. 3 or 4) that is less than or equal to a predetermined threshold value. The second electronics region 110B likewise comprises a number of electrical and/or electronic components and generates, during operation, a second thermal power loss 111B above the predetermined threshold value (see FIG. 3 or 4). The first electronics region 110A may be operated independently of the second electronics region 110B. The first electronics region 110A provides for example rudimentary functions that make it possible to check an intended function of the electronics unit 110. The second electronics region 110B is for example power electronics that actuate the actuator/sensor devices.

The interface 120 connects the electronics unit 110 in this example to a control computer 210 arranged outside the vacuum housing 205. The control computer 210 is for example configured to control and/or regulate the optics module 100. Due to the arrangement of the optics module 100 in the vacuum housing 205 of the optical system 200, which is for example evacuated during operation of the optical system 200 to a residual gas pressure of $10^{-4}$-$10^{-7}$ Pa, the optics module 100, and for example the electronics unit 110 and the actuator/sensor devices 102, are not able to be cooled via a conventional air cooling system. Instead, provision is made for example for a fluid cooling system 220, for example a water cooling system. The fluid cooling system 220 comprises a cooling circuit 222 that leads from the fluid cooling system 220 arranged outside the vacuum housing 205 through the vacuum housing 205 to the optics module 100. In this example, the cooling circuit 222 also runs through the vacuum-tight housing 105, but this is not mandatory. In some embodiments, the cooling circuit 222 reaches only up to the vacuum-tight housing 105 and is thermally coupled to a heat sink of the vacuum-tight housing 105 (not illustrated). When producing the optical system 200, providing the ready-for-operation fluid cooling system 220 is highly cumbersome.

In this example, the interface 120 comprises multiple sections 122, 123, 124, 207. Each section 122, 123, 124, 207 comprises a respective bundle containing a multiplicity of electrical lines, three lines being illustrated by way of example. The bundles 122, 123, 124 are designed for example as cable bundles. The bundles 207 are designed for example as vacuum interfaces that are arranged in the vacuum housing 205 and in the vacuum-tight housing 105. Each bundle 122, 123, 124, 207 has two ends, wherein the respective end is designed for example as a plug or as a socket having a number of contact pins corresponding to the multiplicity of electrical lines. By way of example, the cable bundles 122, 123, 124 each have a plug on their end and the vacuum interfaces 207 each have a socket facing into the respective housing 105, 205 and a socket facing out of the respective housing 105, 205. The sockets and plugs are designed to correspond mechanically to one another, such that a respective plug is able to be plugged into the respective socket. The respective socket with the matching plug together form a plug connector.

It is pointed out that a respective bundle 122, 123, 124, 207 may have multiple sockets/plugs on a respective end, for example because a distributed arrangement of the plugs/sockets on the respective housing 105, 205 and/or the electronics unit 110 is used due to a cramped installation space. By way of example, one of the cable bundles 122, 123, 124 may be designed in the manner of a breakout cable, wherein multiple cables emanate from a first plug at a first end of the bundle and open out into multiple plugs and/or sockets at a second end of the bundle. Likewise, the respective vacuum interface 207 may comprise multiple plugs and/or sockets on a first side of the respective housing 105, 205 and have just a single plug or a single socket on the other side of the housing 105, 205. A respective bundle may additionally have multiple plugs and/or sockets on both ends.

The first bundle 122 is coupled on one side to an input 112 of the electronics unit 110 and coupled at the other end to the vacuum interface 207 of the vacuum-tight housing 105. The second bundle 123 is coupled on one side to the vacuum interface 207 of the vacuum-tight housing 105 and coupled at the other end to the vacuum interface 207 of the vacuum housing 205. The third bundle 124 is coupled on one side to the vacuum interface 207 of the vacuum housing 205 and coupled at the other end to the control computer 210.

When producing or integrating the optical system 200, this is constructed for example in steps, with for example the electronics unit 110 first being installed in the vacuum-tight housing 105. The electronics unit 110 is therefore integrated very deep into the optical system 200, which is why repairing or exchanging the electronics unit 110 is possible only with a great deal of effort. In order to ensure, prior to installation, that the electronics unit 110 has an intended function, provision is specifically made for the first electronics region 110A, which is able to be operated independently of the second electronics region 110B and for example without an active cooling system. This is achieved for example using the test device 300, explained in more detail with reference to FIG. 5 or 6, and with the method explained with reference to FIG. 7.

Figure 6:
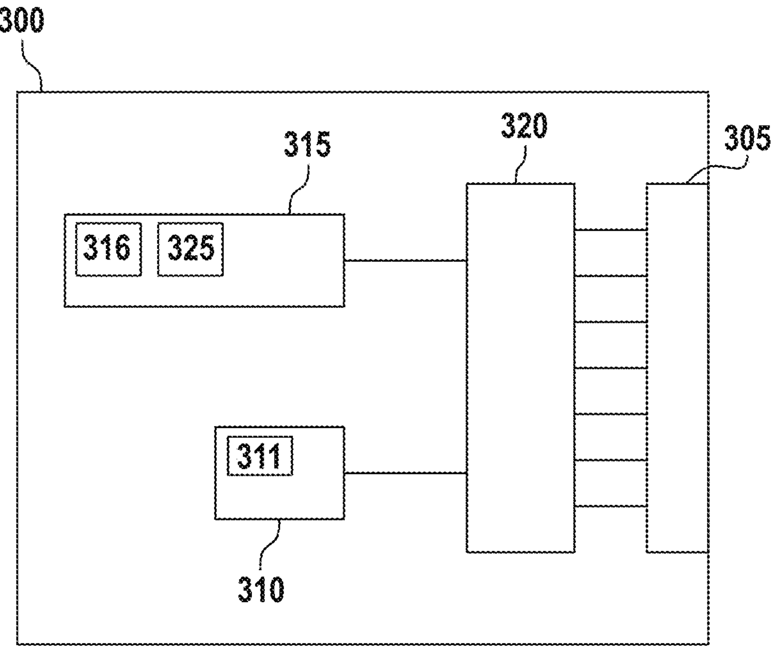
FIG. 6 shows a schematic second exemplary embodiment of a test device.
Figure 7:
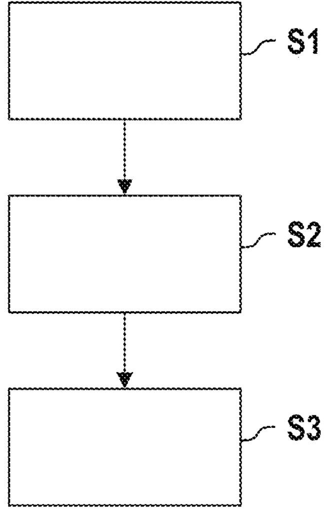
FIG. 7 shows a schematic block diagram of an exemplary method for checking a function of an electronics unit.

The interface 120 may also be checked accordingly. This is advantageous since, in any coupling process in which a further bundle 122-124, 207 is added to the interface 120, a fault or defect may occur; for example, a contact pin in one of the plug connectors involved is bent or breaks during the process, this remaining unnoticed by an operator performing these tasks. The interface 120 is therefore advantageously checked following each coupling process or integration step. For this purpose, the test device 300 explained with reference to FIG. 6 is used and the method described with reference to FIG. 7 is applied.

FIGS. 3 and 4 each show a schematic exemplary embodiment of an optics module 100 having an electronics unit 110 having a first electronics region 110A and a second electronics region 110B. The optics module 100 is configured for example for use in an optical system 200 (see FIG. 2). The electronics unit 110 is designed to configure the respective actuator/sensor device 102 on the basis of received actuation data. The actuation data are received via an interface 120 and the input 112, 112A, 112B. The electronics unit 110 has a first electronics region 110A containing a number of electrical and/or electronic component parts and has a second electronics region 110B containing a number of electrical and/or electronic component parts. The first electronics region 110A generates, during operation, a first thermal power loss 111A that is less than or equal to a predetermined threshold value. The second electronics region 110B generates, during operation, a second thermal power loss 111B above the predetermined threshold value.

The respective electronics unit 110 is arranged in a vacuum-tight housing 105, wherein the electronics unit 110 is located in a gas atmosphere under for example normal pressure, that is to say around 100 hPa. This makes it possible to use conventional electrical and/or electronic components for the electronics unit 110 instead of ones that are designed specifically for operation in a vacuum. It is thus possible to use comparatively simple and inexpensive production methods to produce the electronics unit 110.

The predetermined threshold value for the thermal power loss is predetermined such that the electronics unit 110 is able to withstand this continuously without active cooling, without suffering damage in the process, for example without overheating in the process. This relates for example to a configuration in which the optics module 100 is arranged in a vacuum housing 205 (see FIG. 2) of the optical system 200 and an ambient temperature around the vacuum housing 205 is in a range conventional for such optical systems, that is to say for example between 10° C.-40° C. or else between 0° C.-60° C. The first thermal power loss 111A is transferred for example from the first electronics region 110A to the vacuum-tight housing 105 and is emitted thereby as thermal radiation and thus dissipated. Provision may be made to provide, in sections, a heat sink for the transfer of the first thermal power loss 111A, this heat sink, not illustrated, having a high thermal conductivity, such as for example copper or aluminium. The heat sink may be used to quickly dissipate the incident thermal energy from the location where it arises and for example transfer it to an appropriate emission surface (not illustrated) in the vacuum-tight housing 105.

The same applies to a thermal power loss that is above the threshold value, whereby this must not arise continually without active cooling in order to protect the electronics unit 110 against damage and overheating. Operation of the second electronics region 110B without an active cooling system is for example thus not possible. For this reason, the optics module 100 has a cooling circuit 222 that is configured to dissipate the second thermal power loss 111B. The cooling circuit 222 should for example be coupled to a fluid cooling system 220 (see FIG. 2) of the optical system 200 before the second electronics region 110 is able to be operated.

In both exemplary embodiments illustrated in FIGS. 3 and 4, the first electronics region 110A is able to be operated independently of the second electronics region 110B. By way of example, the electronics unit 110 has a test operating mode in which only the first electronics region 110A is operated. This makes it possible to test the function of the electronics unit 110 before it is integrated deep into the optical system 200, which has the advantage, in the case of a defect, that it is not necessary to dismantle the entire optical system 200 again in order to exchange or to repair the electronics unit 110. In the test operating mode, the correct wiring of the interface 120 may additionally be checked. It is pointed out that the interface 120 may comprise a variable number of bundles 122 of electrical lines and/or plug connectors 121, depending on the state of integration of the optical system 200.

In the exemplary embodiment of FIG. 3, the first and the second electronics region 110A, 110B are integrated jointly on a circuit board. The two regions 110A, 110B also divide a common input 112 via which for example actuation data for actuating the actuator/sensor devices 102 are received. The actuation data are transmitted via the interface 120, wherein the interface 120 is coupled to the input 112 via a bundle 122 of electrical lines. The interface 120 is for example extended by further bundles during the production of the optical system 200.

Although the two electronics regions 110A, 110B are integrated on a common circuit board, they are for example physically separate from one another. In other words, for example, the first electronics region 110A comprises a first set of electrical and/or electronic component parts and the second electronics region comprises a second set of electrical and/or electronic component parts, wherein the first set and the second set are separate from one another. Electrical lines that transmit electrical signals from the input 112 to the first electronics region 110A may also run separately from those that transmit electrical signals from the input to the second electronics region 110B; for example, these may run in different planes of the circuit board. As an alternative thereto, some of the electrical lines may be used jointly by the first and second electronics region 110A, 110B, for example operating voltage lines, these being for example "daisy-chained" through the first electronics region 110A. Electrical lines may also be designed in the form of bus signal lines, as known from bus communication systems.

In the exemplary embodiment of FIG. 4, the first and the second electronics region 110A, 110B are integrated on separate circuit boards. Each electronics region 110A, 110B therefore has its own input 112A, 112B. The respective bundles 122A, 122B of electrical lines for transmitting the actuation data nevertheless open out, in this example, into a common plug connector 121. In some embodiments, separate plug connectors may also be provided (not illustrated).

The electronics unit 110 is connected, via the interface 120, for example to a control control computer 210, as illustrated in FIG. 2. Instead of the control computer 210, however, a test device 300, as described below with reference to FIGS. 5 and 6, may also be coupled to the electronics unit 110 by way of the interface 120, for example for test purposes.

Figure 5:
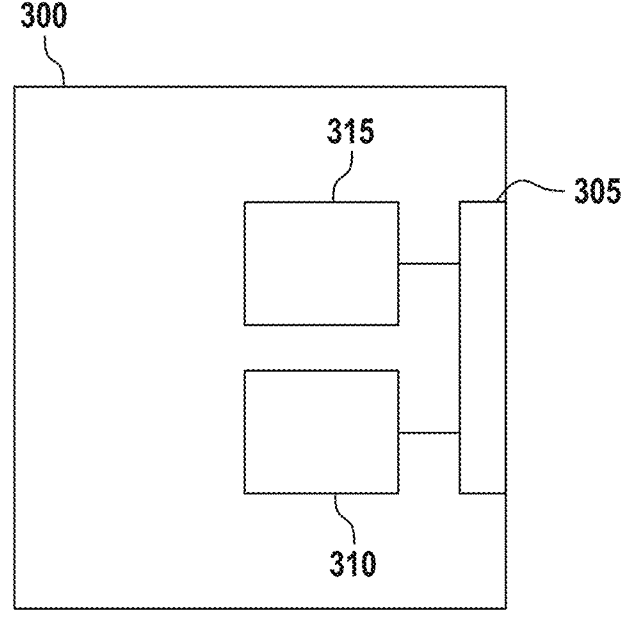
FIG. 5 shows a schematic first exemplary embodiment of a test device.

FIG. 5 shows a schematic first exemplary embodiment of a test device 300 for checking a function of an electronics unit 110 (see FIG. 2-4) of an optics module 100 (see FIG. 2-4) of an optical system 200 (see FIG. 2). The electronics unit 110 is arranged for example in a vacuum-tight housing 105 (see FIG. 2-4) of the optics module 100 and the optics module 100 is arranged for example in a vacuum housing 205 (see FIG. 2) of the optical system 200. The test device 300 comprises a plug connector 305 for connecting the test device 300 to the respective electronics unit 110. The test device 300 may be coupled directly to an input 112 (see FIG. 2 or 3) of the electronics unit 110 via a bundle 122 (see FIG. 2 or 3), or else be coupled to the electronics unit 110 via an interface 120 (see FIG. 2-4) comprising multiple bundles 122-124, 207. The plug connector 305 may be designed as a socket and/or as a plug. The test device 300 additionally comprises a test mode unit 310 for selectively actuating the first electronics region 110A (see FIG. 2-4), such that only the first electronics region 110A is operated, without the second electronics region 110B (see FIG. 2-4), and a determination unit 315 for determining whether the first electronics region 110A has an intended function.

The test device 300 may be used, in the test mode, to check the function of the respective electronic unit 110, without an active cooling system being necessary.

FIG. 6 shows a schematic second exemplary embodiment of a test device 300 for checking a function of an electronics unit 110 (see FIG. 2-4) of an optics module 100 (see FIG. 2-4) of an optical system 200 (see FIG. 2). The electronics unit 110 is arranged for example in a vacuum-tight housing 105 (see FIG. 2-4) of the optics module 100 and the optics module 100 is arranged for example in a vacuum housing 205 (see FIG. 2) of the optical system 200. The test device 300 has all of the features of the test device 300 from FIG. 5. The test device 300 additionally comprises a generation unit 311, which is configured to generate an electrical test signal for checking a pair of electrical lines of the interface 120, and an acquisition unit 316, which is configured to acquire a response signal when the test signal is applied to the pair of electrical lines. The generation unit 311 comprises for example a current source, a voltage source and/or a function generator. The generation unit 311 may, as illustrated, form part of the test mode unit 310, but it may also be designed separately. The acquisition unit 316 comprises for example measuring units for acquiring a current, a voltage and/or a phase between current and voltage. The acquisition unit 316 may form part of the test mode unit 310 or else of the determination unit 315. The test device 300 additionally comprises a multiplexing unit 320 for connecting a respective pair of electrical lines of electrical lines coupled to the plug connector 305 to the generation unit 310 and to the acquisition unit 315. The determination unit 315 comprises a comparison unit 325 for comparing the acquired response signal for the pair of electrical lines with a response signal predetermined for the pair. The determination unit 315 is furthermore configured to determine, on the basis of the comparison, whether a defect is present in one of the electrical lines of the pair.

FIG. 7 shows a schematic block diagram of an exemplary method for checking a function of an electronics unit 110 (see FIG. 2-4) of an optics module 100 (see FIG. 2-4). The optics module 100 is designed for example as described with reference to FIG. 2, 3 or 4. In a first step S1, the electronics unit 110 and/or the optics module 100 is coupled to a test device 300 (see FIG. 5 or 6). This is achieved for example via the interface 120 of the optics module 100 and the input 112 of the electronics unit 110. In a second step S2, the first electronics region 110A is operated, without the second electronics region 110B being operated. This ensures that only the first thermal power loss 111A (see FIG. 3 or 4) arises. In this test operating mode, in which only the first electronics region 110A is operated, the electronics unit 110 is able to be operated continuously without in the process suffering damage or overheating. In a third step S3, an intended function of the first electronics region 110A is checked.

This method can be performed using the test device 300 from FIG. 5 or 6.

Figure 8:
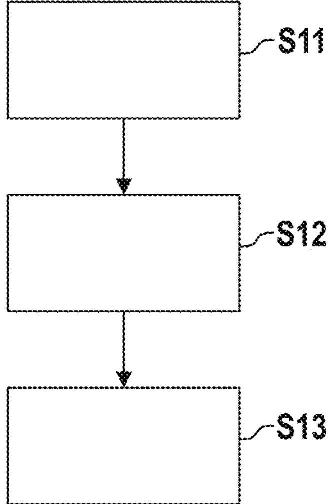
FIG. 8 shows a schematic block diagram of an exemplary method for producing an optical system.

FIG. 8 shows a schematic block diagram of an exemplary method for producing an optical system 200, for example the optical system 200 from FIG. 2. The optical system 200 comprises a number of optical modules 100 (see FIG. 2-4).

The respective optics module 100 comprises the components: a number of displaceable optical elements 101 (see FIG. 2-4) for guiding radiation in the optical system 200, a number of actuator/sensor devices 102 (see FIG. 2-4), wherein at least one of the actuator/sensor devices 102 is assigned to the respective optical element 101 and wherein the respective actuator/sensor device 102 is configured to displace the assigned optical element 101 and/or to acquire a position of the assigned optical element 101, a vacuum-tight housing 105 (see FIG. 2-4), and an electronics unit 110 able to be arranged in the vacuum-tight housing 105 (see FIG. 2-4) and configured to actuate the respective actuator/sensor device 102 on the basis of received actuation data. The electronics unit 10 comprises a first electronics region 110A (see FIG. 2-4) containing a number of electrical and/or electronic component parts and that generates, during operation, a first thermal power loss 111A (see FIG. 3 or 4) that is less than or equal to a predetermined threshold value, and comprises a second electronics region 110B (see FIG. 2-4) containing a number of electrical and/or electronic component parts and that generates, during operation, a second thermal power loss 111B above the predetermined threshold value.

In a first step S11, the components of the optics module 100 are provided. In a second step S12, the function of the electronics unit 110 is checked using the method from FIG. 7. In a third step S13, the optics module 100 is integrated, in other words the components are assembled to form the optics module 100 when the function of the electronics unit 110 is present. All of the optics modules 100 for the optical system 200 are thereby assembled. In further steps (not illustrated), the optical modules 100 are integrated into a vacuum housing 205 (see FIG. 2) of the optical system 200, wherein, following installation, the function of the electronics unit 110 is checked again as described above using a test device 300 (see FIG. 5 or 6).

Although the present disclosure has been described with reference to exemplary embodiments, it is modifiable in various ways.

LIST OF REFERENCE SIGNS

1 Projection exposure apparatus
2 Illumination system
3 Light source
4 Illumination optical unit
5 Object field
6 Object plane
7 Reticle
8 Reticle holder
9 Reticle displacement drive
10 Projection optical unit
11 Image field
12 Image plane
13 Wafer
14 Wafer holder
Wafer displacement drive
16 Illumination radiation
17 Collector
18 Intermediate focal plane
19 Deflection mirror
20 First facet mirror
21 First facet
22 Second facet mirror
23 Second facet
100 Optics module
101 Optical element
102 Actuator/sensor device
105 Vacuum-tight housing
110 Electronics unit
110A Electronics region
110B Electronics region
112 Input
112A Input
112B Input
114 Processing unit
116 Processing unit
120 Interface
121 Plug connector
122 Bundle
122A Bundle
122B Bundle
123 Bundle
124 Bundle
200 Optical system
205 Vacuum housing
207 Vacuum interface
210 Control computer
220 Fluid cooling system
222 Cooling circuit
300 Test device
305 Plug connector
310 Test mode unit
311 Generation unit
315 Determination unit
316 Acquisition unit
320 Multiplexing unit
325 Comparison unit
M1 Mirror
M2 Mirror
M3 Mirror
M4 Mirror
M5 Mirror
M6 Mirror
S1 Method step
S2 Method step
S3 Method step
S11 Method step
S12 Method step
S13 Method step

What is claimed is:

1. An optical system, comprising:
a number of optics modules,
wherein:
for each of at least some of the optics modules of the number of optics modules, the optics module comprises:
a number of displaceable optical elements configured to guide radiation in the optical system, the number of displaceable optical elements comprising a first optical element;
a number of actuator/sensor devices comprising a first actuator/sensor device, the first actuator/sensor device configured to displace the first optical element and/or to acquire a position of the first optical element;
a vacuum-tight housing; and
an electronics unit in the vacuum-tight housing, the electronics unit configured to actuate the first actuator/sensor device based on received actuation data, the electronics unit comprising a first electronics region and a second electronics region, the first electronics region comprising a number of electrical and/or electronic component parts configured so that during operation the first electronics region generates a first thermal power loss that is less than or equal to a threshold value, the second electronics region comprising a number of electrical and/or electronic component parts configured so that during operation the second electronics region generates a second thermal power loss above the threshold value, and the first electronics region being operable independently of the second electronics region.

2. The optical system of claim 1, wherein, for each of the at least some of the optics modules of the number of optics modules:

the optics module in a vacuum housing of the optical system; and the first electronics region is configured to be continuously operated without active cooling of the electronics unit and/or of the optics module.

3. The optical system of claim 2, wherein for each of at least some of the optics modules of the number of optics modules:

the second electronics region is configured to use active cooling of the electronics unit and/or of the optics module; and the optics module comprises a fluid cooling circuit coupled to a fluid cooling system of the optical system so that during operation of the optical system the fluid cooling circuit dissipates the second thermal power loss of the second electronics region.

4. The optical system of claim 1, wherein, for each of at least some of the optics modules of the number of optics modules, the first electronics region is physically separate from the second electronics region.

5. The optical system of claim 1, wherein, for each of at least some of the optics modules of the number of optics modules:

the first electronics region comprises a multiplicity of electrical and/or electronic component parts; and a sum of the thermal power losses of the component parts during operation is less than or equal to the threshold value.

6. The optical system of claim 1, wherein, for each of at least some of the optics modules of the number of optics modules:

the first electronics region comprises a multiplicity of electrical and/or electronic component parts;

a subset of the multiplicity of component parts is selectively operable; and the subset is configured so that a sum of the thermal power losses of the respective subset is less than or equal to the threshold value.

7. The optical system of claim 1, wherein, for each of at least some of the optics modules of the number of optics modules:

the number of electrical and/or electronic component parts of the first electronics region comprises at least one member selected from the group consisting of:

a storage unit configured to store operating parameters for operating the optical system;

a temperature monitoring unit configured to monitor: i) a temperature of the first electronics region of the electronics unit; and/or ii) a temperature of the optics module; and an identification unit configured to determine: i) a hardware version of the optics module and/or of elements of the optics module; and/or a software version of the optics module and/or of elements of the optics module.

8. The optical system of claim 1, wherein, for each of at least some of the optics modules of the number of optics modules:

the processor is operatable in a first operating mode in which the thermal power loss of the processor is less than or equal to the threshold value and in which the processor is assigned to the first electronics region;

the processor is operable in a second operating mode in which the thermal power loss of the processor is greater than the threshold value and in which the processor is assigned to the second electronics region.

9. The optical system of claim 1, wherein, for each of at least some of the optics modules of the number of optics modules:

the second electronics region comprises power electronics configured to provide an operating power to operate, based on received actuation data and/or received sensor signals: i) the first actuator/sensor device; and/or ii) a processor configured to determine actuation and/or control signals for the first actuator/sensor device.

10. The optical system of claim 1, wherein, for each of at least some of the optics modules of the number of optics modules:

the electronics unit comprises different, dedicated connection elements configured to connect the first electronics region and to connect the second electronics region;

a first connection element of the dedicated connection elements is configured to transmit electrical signals comprising the actuation data and/or analogue and/or digital data signals and to provide an operating voltage to operate the first electronics region; and a second connection element of the dedicated connection elements is configured to transmit electrical signals comprising the actuation data and/or analogue and/or digital data signals and to provide an operating voltage to operate the second electronics region.

11. The optical system of claim 1, wherein, for each of at least some of the optics modules of the number of optics modules:

the electronics unit comprises a common connection element connecting the first electronics region and connecting the second electronics region;

the common connection element is configured to transmit electrical signals comprising the actuation data and/or analogue and/or digital data signals and to provide an operating voltage to operate both the first and second electronics regions.

12. The optical system of claim 11, wherein, for each of at least some of the optics modules of the number of optics modules:

the common connection element comprises an electrical line configured to transmit electrical signals for the first electronics region and for the second electronics region;

a switching element is in the electrical line; and the switching element is configured to selectively interrupt the electrical line from the second electronics region.

13. The optical system of claim 11, wherein, for each of the at least some of the optics modules of the number of optics modules:

the optics module in in a vacuum housing of the optical system; and the first electronics region is configured to be continuously operated without active cooling of the electronics unit and/or of the optics module.

14. The optical system of claim 1, wherein, for each of the at least some of the optics modules of the number of optics modules:

the optics module in in a vacuum housing of the optical system;

the first electronics region is configured to be continuously operated without active cooling of the electronics unit and/or of the optics module; and the first electronics region is physically separate from the second electronics region.

15. The optical system of claim 1, wherein, for each of the at least some of the optics modules of the number of optics modules:

the optics module in in a vacuum housing of the optical system;

the first electronics region is configured to be continuously operated without active cooling of the electronics unit and/or of the optics module;

the first electronics region comprises a multiplicity of electrical and/or electronic component parts; and a sum of the thermal power losses of the component parts during operation is less than or equal to the threshold value.

16. A test device, wherein:

the test device is configured to check a function of an electronics unit of an optics module of an optical system according to claim 1; and the test device comprises:

a plug connector configured to connect the test device to the electronics unit;

a test mode unit configured to selectively actuate the first electronics region so that only the first electronics region is operated without operation of the second electronics region; and a determination unit configured to determine when the first electronics region has an intended function.

17. An apparatus, comprising:

an optical system according to claim 1, wherein the apparatus is a lithography apparatus.

18. An arrangement, comprising:

an optical system according to claim 1; and a test device configured to check a function of the electronics unit of the optics module of the optical system, wherein the test device comprises:

a plug connector configured to connect the test device to the electronics unit;

a test mode unit configured to selectively actuate the first electronics region so that only the first electronics region is operated without operation of the second electronics region; and a determination unit configured to determine when the first electronics region has an intended function.

19. A method for checking a function of an electronics unit of an optics module, the optics module comprising: a number of displaceable optical elements configured to guide radiation, the number of displaceable optical elements comprising a first optical element; a number of actuator/sensor devices comprising a first actuator/sensor device, the first actuator/sensor device configured to displace the first optical element and/or to acquire a position of the first; a vacuum-tight housing, wherein: the electronics unit is arrangeable in the vacuum- tight housing; the electronics unit is configured to actuate the first actuator/sensor device based on received actuation data; the electronics unit comprises a first electronics region and a second electronics region, the first electronics region comprises a number of electrical and/or electronic component parts that generate during operation a first thermal power loss that is less than or equal to a predetermined threshold value; the second electronics region comprising a number of electrical and/or electronic component parts that generate during operation a second thermal power loss above the predetermined threshold value, the method comprising:

coupling the electronics unit and/or the optics module to a test device;

operating the first electronics region without the second electronics region being operated; and checking an intended function of the first electronics region.

20. A method of producing an optical system comprising a number of optics modules, wherein: each of at least some of the optics modules comprises: a number of displaceable optical elements configured to guide radiation in the optical system; a number of actuator/sensor devices; a vacuum-tight housing; and an electronics unit, wherein: a first actuator/sensor device being assigned to a first optical element; the first actuator/sensor device being configured to displace the first optical element and/or to acquire a position of the first optical element; the electronics unit is arrangeable in the vacuum-tight housing; the electronics unit is configured to actuate the first actuator/sensor device based on received actuation data; the electronics unit comprises a first electronics region and a second electronics region; the first electronics region comprises a number of electrical and/or electronic component parts that generate during operation a first thermal power loss that is less than or equal to a predetermined threshold value; and the second electronics region comprising a number of electrical and/or electronic component parts and that generate during operation a second thermal power loss above the predetermined threshold value, the method comprising:

providing the components of the optics module;

coupling the electronics unit and/or the optics module to a test device;

operating the first electronics region without the second electronics region being operated;

checking an intended function of the first electronics region; and integrating the optics module when the function of the electronics unit is present.

* * * * *